(12) United States Patent
Hamade et al.

(10) Patent No.: US 8,343,712 B2
(45) Date of Patent: Jan. 1, 2013

(54) METHOD FOR MANUFACTURING INKJET RECORDING HEAD

(75) Inventors: Yohei Hamade, Tokyo (JP); Etsuko Sawada, Tokyo (JP); Hiroaki Mihara, Machida (JP); Satoshi Tsutsui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/280,064

(22) Filed: Oct. 24, 2011

(65) Prior Publication Data
US 2012/0107746 A1 May 3, 2012

(30) Foreign Application Priority Data

Oct. 28, 2010 (JP) .................. 2010-242246
Dec. 17, 2010 (JP) .................. 2010-282231

(51) Int. Cl.
*B41J 2/16* (2006.01)

(52) U.S. Cl. ...................... 430/320; 430/330

(58) Field of Classification Search .......... None
See application file for complete search history.

(56) References Cited

U.S. PATENT DOCUMENTS

2001/0010304 A1* 8/2001 Shimomura ............ 216/27
2003/0198899 A1* 10/2003 Ohkuma ................ 430/320
2007/0085877 A1* 4/2007 Ohkuma et al. ........ 347/45

FOREIGN PATENT DOCUMENTS

JP 2010-23525 A 2/2010

* cited by examiner

*Primary Examiner* — John A. McPherson
(74) *Attorney, Agent, or Firm* — Canon U.S.A., Inc., IP Division

(57) ABSTRACT

A method for manufacturing an inkjet recording includes forming a photo-cationic polymerizable resin layer containing a photo-cationic polymerizable resin material on a substrate; performing pattern exposure of the photo-cationic polymerizable resin layer to form a latent image of a fine pattern including an ejection port; forming a water repellent layer containing a water repellent material capable of forming a bond in reaction with the photo-cationic polymerizable resin material on the photo-cationic polymerizable resin layer; developing the photo-cationic polymerizable resin layer to thereby remove a non-exposed portion of the photo-cationic polymerizable resin layer and remove a water repellent layer portion corresponding to the non-exposed portion to thereby form the fine pattern; and curing the photo-cationic polymerizable resin layer by heat treatment to form a member provided with the fine pattern and promote a reaction of the photo-cationic polymerizable resin material and the water repellent material.

12 Claims, 6 Drawing Sheets

(A) PATTERN RESIST FORMATION STEP (B) PHOTO-CATIONIC POLYMERIZABLE RESIN LAYER FORMATION STEP (C) PATTERN EXPOSURE STEP (D) BAKE STEP (E) WATER REPELLENT LAYER FORMATION STEP (F) DEVELOPMENT STEP (G) PATTERN RESIST REMOVAL STEP (H) BAKE STEP

METHOD FOR MANUFACTURING INKJET RECORDING HEAD

BACKGROUND OF THE INVENTION

1. Field of the Invention

The present invention relates to a method for manufacturing an inkjet recording head capable of ejecting ink liquid droplets.

2. Description of the Related Art

It is important in an inkjet recording head to control the surface properties of an ejection port surface for obtaining good ink ejection capability. When an accumulation of ink remains near the ejection port, the flight direction of ink droplets deviates in some cases or load is applied to ink droplets to be ejected to reduce the ejection rate of the ink droplets in some cases. Mentioned as a method for improving these circumstances and ejecting ink with good accuracy is a method for subjecting the circumference of the ejection port to water repellent treatment.

Moreover, in order to arrange ejection ports with high density, a method for using photolithography for the formation of a member provided with the ejection ports is useful. Japanese Patent Laid-Open No. 2010-23525 discloses the use of a condensation product of a hydrolyzable silane compound having a fluoride containing group and a hydrolyzable silane compound having a cationic polymerizable group as a water repellent material having photosensitivity. In Japanese Patent Laid-Open No. 2010-23525, the ejection port surface is subjected to water repellent treatment by performing patterning exposure and development of a water repellent layer and a layer forming the member provided with the ejection ports at one time using the water repellent material.

SUMMARY OF THE INVENTION

In general, most of water repellent materials contain a fluorine element whose affinity with organic resin is low, and therefore aggregation of the water repellent material occurs depending on application conditions, so that dents are generated in the member provided with the ejection ports in some cases. Aspects of the present invention provide an inkjet recording head that achieves high-density and high-quality printing by suppressing the generation of the dents in the member provided with the ejection ports due to the aggregation of the water repellent material and forming the ejection port surface with excellent water repellency.

A method for manufacturing an inkjet recording head according to an aspect of the present invention is a method for manufacturing an inkjet recording head having a substrate, a member provided with an ejection port for ejecting ink formed on the substrate, and a water repellent layer formed on the member, and the method includes a process for forming a photo-cationic polymerizable resin layer containing a photo-cationic polymerizable resin material on the substrate, a process for performing pattern exposure of the photo-cationic polymerizable resin layer to form a latent image of a fine pattern including the ejection port, a process for forming the water repellent layer containing a water repellent material capable of forming a bond in reaction with the photo-cationic polymerizable resin material on the photo-cationic polymerizable resin layer on which the latent image is formed, a process for developing the photo-cationic polymerizable resin layer to thereby remove a non-exposed portion of the photo-cationic polymerizable resin layer and remove a water repellent layer portion corresponding to the non-exposed portion to thereby form the fine pattern, and a process for curing the photo-cationic polymerizable resin layer by heat treatment to form a member provided with the fine pattern and promote a reaction of the photo-cationic polymerizable resin material and the water repellent material.

Further features of the present invention will become apparent from the following description of exemplary embodiments with reference to the attached drawings.

BRIEF DESCRIPTION OF THE DRAWINGS

FIGS. 6A through 6B are schematic views illustrating examples of plasma treatment devices according to aspects of the invention in which FIG. 6A is a schematic view of a direct type plasma treatment device and FIG. 6B is a schematic view of a remote type plasma treatment device.

DESCRIPTION OF THE EMBODIMENTS

In general, most of water repellent materials contain a fluorine element whose affinity with organic resin is low, and therefore aggregation of the water repellent material occurs depending on application conditions. In particular, when a solution of a compound containing a perfluoroalkyl group or a perfluoropolyether group which exhibits high water repellency is applied, the water repellent material aggregates in a solvent evaporation process in some cases.

Figure 1A:
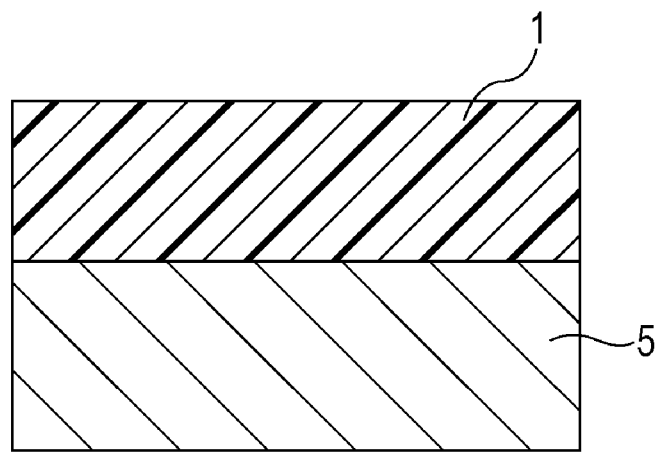
FIGS. 1A through 1B are cross sectional views illustrating a method for forming a former water repellent layer.
Figure 1B:
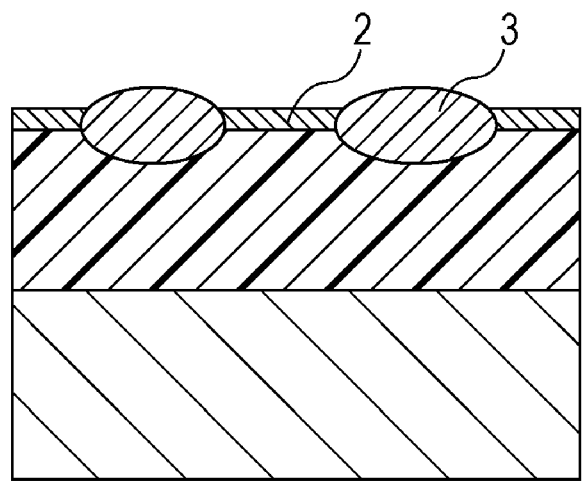

As illustrated in FIGS. 1A through 1B, in Patent Document 1, an uncured photosensitive resin layer 1 is formed (FIG. 1A), a water repellent material solution is applied onto the photosensitive resin layer 1 provided on a substrate 5, and heat-treatment is performed to thereby provide a water repellent material layer 2 as water repellent treatment (FIG. 1B). Thereafter, by performing pattern exposure and development, a fine pattern including an ejection port is formed. When the water repellent material is applied, the photosensitive resin layer 1 is uncured and soft. Therefore, there is apprehension that while passing through processes, such as the application of the water repellent material on the photosensitive resin layer 1, pattern exposure, and heating, aggregates 3 of the water repellent material sinks into the photosensitive resin layer 1 as illustrated in FIG. 1B depending on the type of the water repellent material solution, so that dents are generated. The generation of the dents in the photosensitive resin layer 1 due to the aggregation of the water repellent material results in the generation of dents in the surface of a member in which ejection ports are present (referred to as an ejection port surface) because the photosensitive resin layer 1 is the member to be provided with the ejection ports. The dents formed in the ejection port surface partially lies on the edge of the ejection port, and therefore the surface shape of the circumference of the ejection port becomes uneven, so that ink ingredients, such as pigments, are likely to adhere, which leads to the occurrence of poor printing. In some inkjet heads, the ejection port surface is covered with a protective tape until a user starts using after being shipped, and the user removes the protective tape when starting using. When the ejection port surface has irregularities, the adhesive of the protective tape is likely to remain on the ejection port surface when removing the tape, which becomes a factor of influence on printing in some cases.

Figure 2A:
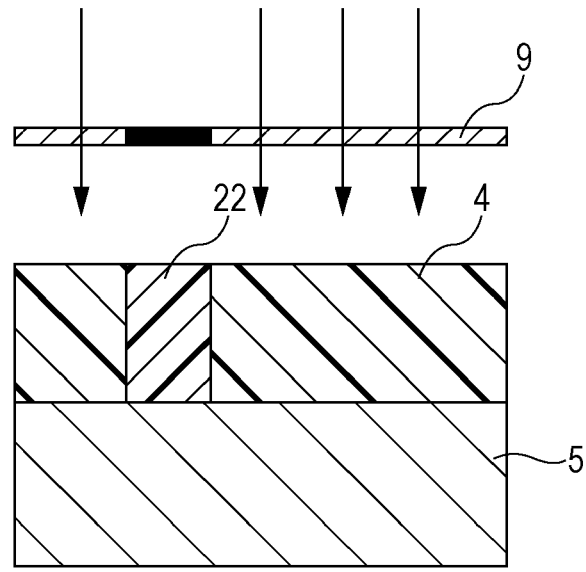
FIGS. 2A through 2C are cross sectional views illustrating a method for forming a water repellent layer according to aspects of the invention.
Figure 2B:
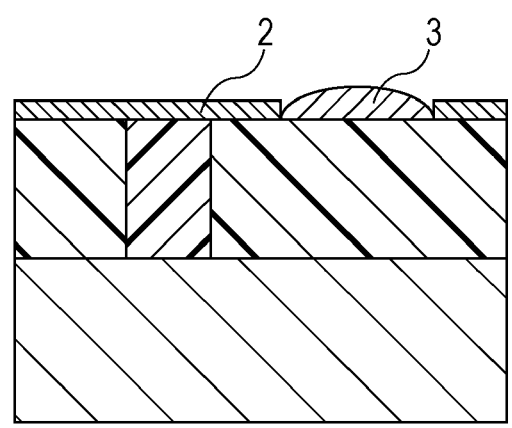
Figure 2C:
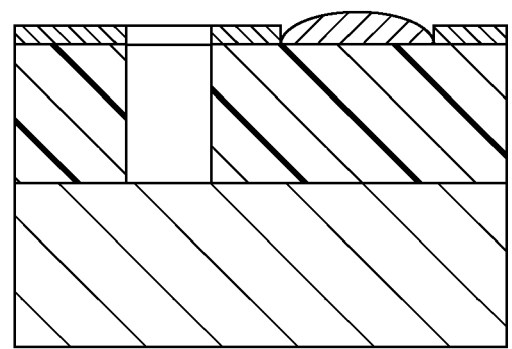

The cross sectional views when the water repellent layer is formed by a method according to aspects of the invention is illustrated in FIGS. 2A through 2C. By forming a negative type photosensitive resin layer 1 as an example of an uncured curable resin layer on the substrate 5, and then performing pattern exposure of the photosensitive resin layer 1 using a mask 9, a latent image of a fine pattern including an ejection port is formed (FIG. 2A). In an exposed portion 4 of the photosensitive resin layer, a polymerization reaction of the resin progresses to cure, whereby the hardness of the resin increases as compared with that of a non-exposed portion 22. Thereafter, by forming a water repellent layer containing a water repellent material (FIG. 2B), and then removing the non-exposed portion by development treatment, a fine pattern is formed (FIG. 2C). As illustrated in FIGS. 2A through 2C, a deformation of the photosensitive resin layer 1 can be suppressed by forming the water repellent layer 2 after the formation of the latent image.

Figure 3:
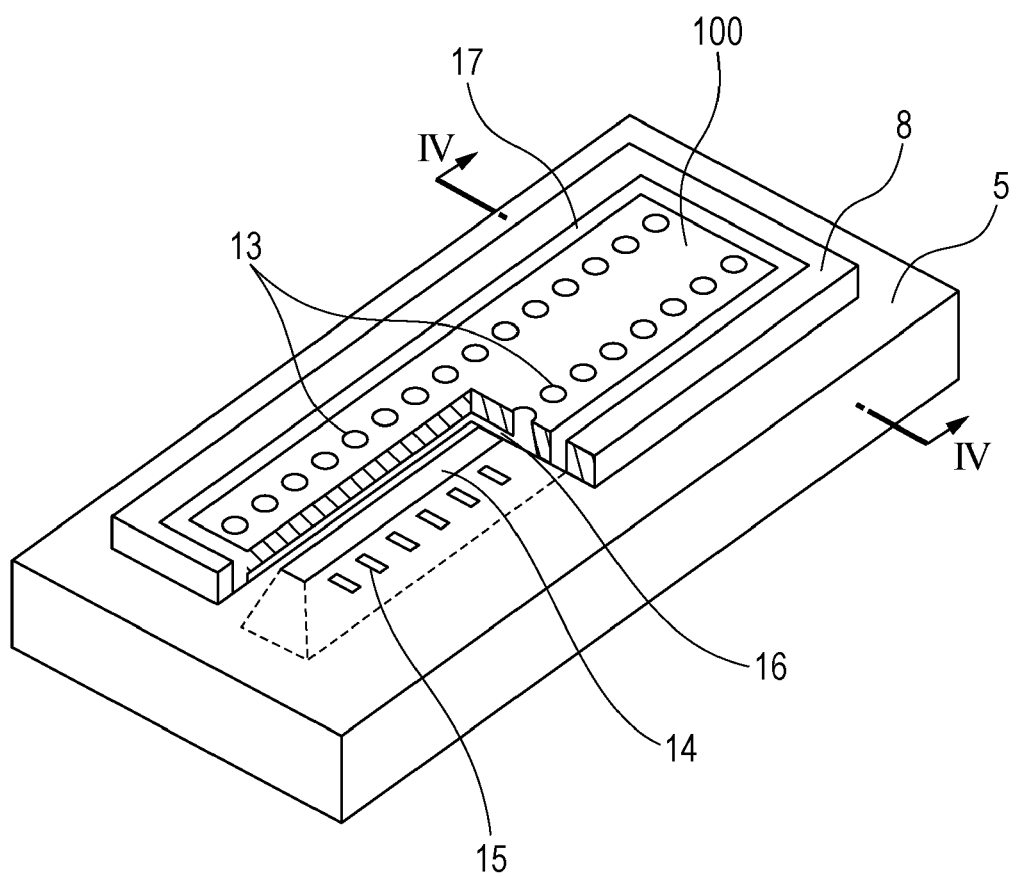
FIG. 3 is a perspective view illustrating an example of an inkjet recording head manufactured by a method according to aspects of the invention.

FIG. 3 illustrates an example of an inkjet recording head to be manufactured by a method according to aspects of the invention. The inkjet recording head illustrated in FIG. 3 has an ejection port member 100 provided with ejection ports 13 for ejecting ink on the substrate 5 having a plurality of energy generation elements 15 for ejecting ink, an ink flow path 16 which communicates with the ejection ports 13 and holds ink, and a groove 17 formed in order to reduce the internal stress of the ejection port member 100. Moreover, the substrate 5 is provided with an ink supply port 14 which supplies ink to the ink flow path 16. The outer surface on which the ejection ports of the ejection port member 100 opens is water repellent.

Hereinafter, an example of embodiments of the invention will be described in detail but the invention is not limited thereto. FIGS. 4A through 4H illustrate views illustrating the method for manufacturing an inkjet recording head according to aspects of the invention. FIGS. 4A to 4H are process cross sectional views equivalent to the cross section taken along the IV-IV line of FIG. 3.

Figure 4A:
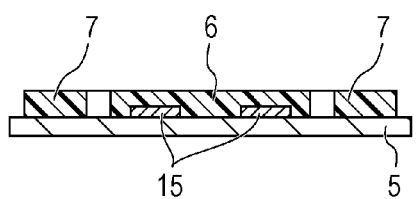
FIGS. 4A through 4H are cross sectional views illustrating an example of a method for manufacturing an inkjet recording head according to aspects of the invention.

First, a foundation 7 for forming the groove 17 that makes the film thickness of an ink flow path pattern 6 and an orifice plate uniform is formed on the substrate 5 provided with the energy generation elements 15 that generate energy for ejecting ink (FIG. 4A). Hereinafter, the ink flow path pattern 6 and the foundation 7 are collectively referred to as a pattern resist. The pattern resist is dissolved and removed in the following process. Therefore, a positive photosensitive resin is used for the pattern resist. Specifically, vinyl ketone photodegradable polymer compounds, such as polymethyl isopropenyl ketone and polyvinyl ketone, are used, for example. As the substrate 5, an Si substrate is suitably used.

Figure 4B:
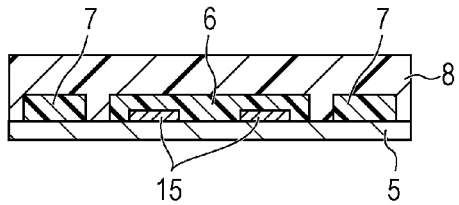

Next, a photo-cationic polymerizable resin layer 8 is formed on the pattern resist (FIG. 4B). The photo-cationic polymerizable resin layer 8 can be formed by application methods, such as a spin coat method, a slit coat method, and a roll coat method, which are generally used.

The photo-cationic polymerizable resin layer 8 contains a photo-cationic polymerizable resin material. Mentioned as the photo-cationic polymerizable resin material are epoxy compounds, vinyl ether compounds, oxetane compounds, and the like. However, since high mechanical strength and strong adhesiveness with the foundation are required, epoxy resin having the properties is suitable. Mentioned as the epoxy resin are a bisphenol A type epoxy resin, a novolactype epoxy resin, and the like. Mentioned as commercially available articles are SU8 (Trade name, manufactured by Nippon Kayaku Co., Ltd.), EHPE3150 (Trade name, manufactured by Daicel Chemical Industries, Ltd.), and the like.

In the epoxy compound, the epoxy equivalent is suitably 2000 or lower and more suitably 1000 or lower. When the epoxy equivalent is 2000 or lower, a reduction in the crosslinking density in a curing reaction, a reduction in the glass transition temperature of a cured product, or a reduction in the adhesiveness can be prevented. In the epoxy compound, the epoxy equivalent is suitably 100 or more.

When the fluidity of the photo-cationic polymerizable resin layer 8 is high, the resolution decreases in some cases. Therefore, the photo-cationic polymerizable resin material is suitably a solid at room temperature of 5 to 35° C.

Mentioned as a photo-cationic polymerization initiator for curing the photo-cationic polymerizable resin layer 8 contained in the photo-cationic polymerizable resin layer 8 are an aromatic iodonium salt and an aromatic sulfonium salt. Furthermore, by the use of a reducing agent in combination with the photo-cationic polymerization initiator and heating, cationic polymerization can be promoted. Mentioned as the reducing agent is a copper triflate, for example, when considering the reactivity and the solubility in epoxy resin.

Figure 4C:
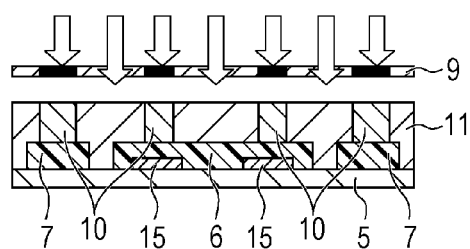
Figure 4D:
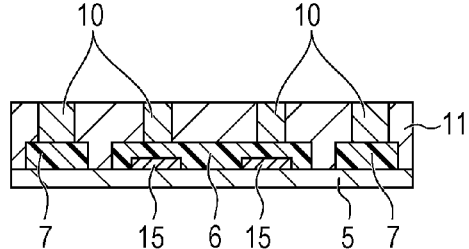

Next, pattern exposure is performed through the mask 9 in such a manner that the position where the ejection ports 13 are formed and the position where the groove 17 is formed of the photo-cationic polymerizable resin layer 8 are the non-exposed portions 10, and the latent image of the fine pattern including the ejection ports is formed (FIG. 4C). Due to acid generated when exposing, crosslinking occurs in the exposed portions 11 in a process for heating the photo-cationic polymerizable resin layer 8 (FIG. 4D). When the crosslinking ratio is excessively low, there is a possibility that the photo-cationic polymerizable resin layer 8 is deformed under the influence of the application of the water repellent material onto the photo-cationic polymerizable resin layer 8 in the following process. Therefore, it is suitable to cure the same to such an extent that the deformation does not occur.

In order to generate a chemical bond between a water repellent layer 12 to be provided in the following process and the photo-cationic polymerizable resin layer 8, it is suitable that a reaction group remains. For example, when an epoxy compound is used as the photo-cationic polymerizable resin material, it is suitable to suppress the crosslinking ratio in such a manner that an epoxy group remains. Here, when the crosslinking ratio indicating the crosslinking degree is defined by the following Equation (1), the crosslinking ratio is suitably 5% or more and 95% or lower. The remaining amount of the epoxy group can be measured by infrared spectroscopy.

$$\text{Crosslinking ratio} = \frac{\left\{\begin{array}{l}(\text{Remaining amount of epoxy group before reaction}) - \\ (\text{Remaining amount of epoxy group after reaction})\end{array}\right\}}{\text{Remaining amount of epoxy group before reaction}} \times 100 \quad (1)$$

In order to increase the reactivity of the photo-cationic polymerizable resin layer 8, it is also useful for the photo-cationic polymerizable resin layer 8 to contain a compound containing a hydroxyl group or a compound capable of generating a hydroxyl group. Mentioned as the compound capable of generating a hydroxyl group are compounds having a hydrolyzable silyl group, for example.

Figure 6A:
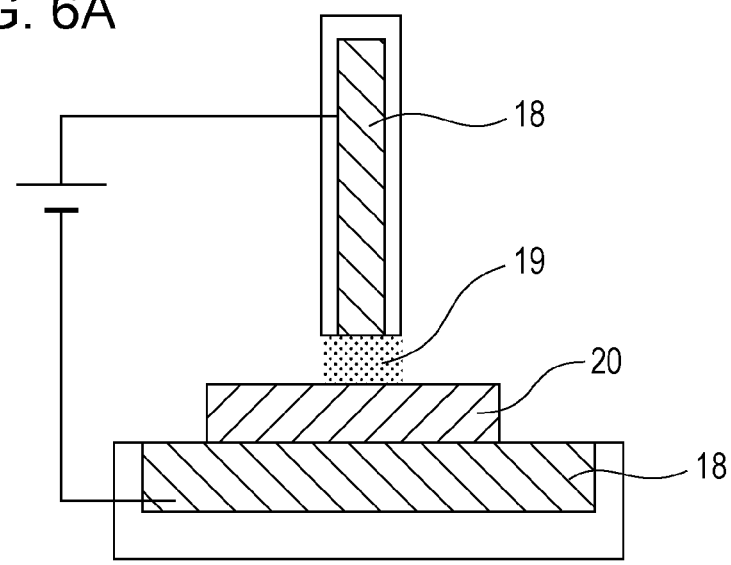
Figure 6B:
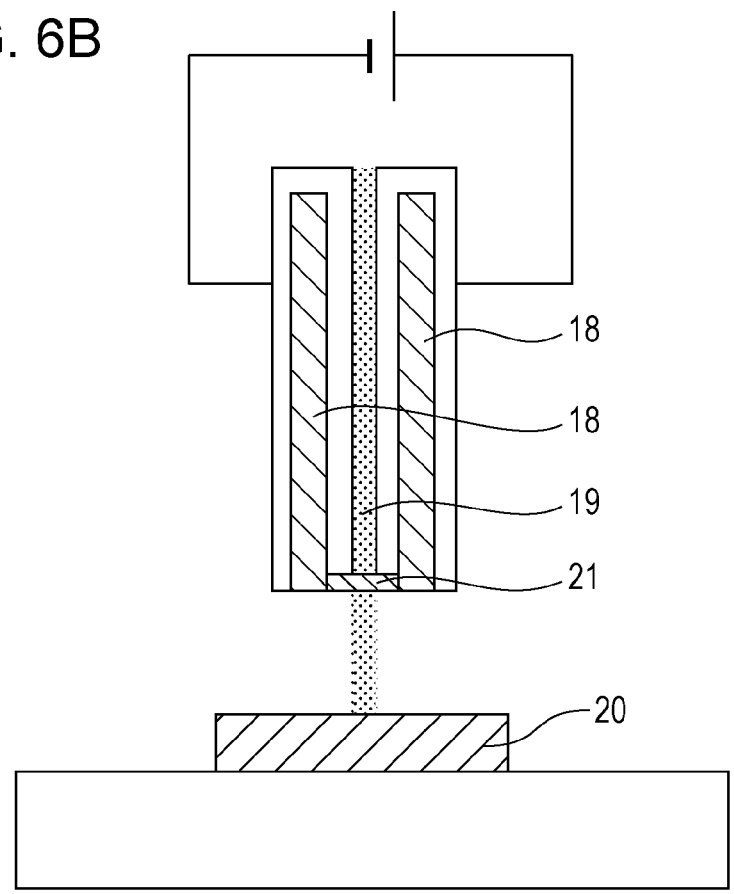

Mentioned as a useful method for increasing the reactivity of the photo-cationic polymerizable resin layer 8 and the water repellent layer 12 is plasma treatment. In general, the plasma is in a ionized gas state and contains active species of various states, such as ion, electron, and radical. The surface of the photo-cationic polymerizable resin layer 8 is activated by the plasma treatment, so that a reactive functional group can be imparted to the surface. Here, mentioned as the plasma treatment are one using a direct type treatment device and one using a remote type treatment device. FIGS. 6A through 6B illustrate configuration examples of the direct type plasma treatment device A and the remote type plasma treatment device B but the invention is not limited thereto. In the direct type plasma treatment, gas to be reacted is introduced between facing electrodes 18, a high frequency electric power is applied to generate plasma 19, and a base material to be treated 20 is disposed between the electrodes to thereby treat the base material. In contrast, the remote type plasma treatment refers to a configuration in which the plasma 19 generated between the electrodes 18 is jetted from the space of the electrodes by carrier gas to treat the base material to be treated 20 at a position distant from the electrodes 18.

When the remote type plasma treatment device is used as the surface treatment of the photo-cationic polymerizable resin layer, a curing reaction of the unexposed portions is efficiently suppressed as described later, so that a functional group capable of reacting with the water repellent material can be introduced into the resin surface.

As the remote type plasma treatment device, there are atmospheric pressure plasma treatment (=normal pressure plasma treatment) in which treatment is performed under atmospheric pressure and reduced-pressure plasma treatment in which treatment is performed under a reduced-pressure environment. The atmospheric pressure plasma treatment includes jetting plasma gas from the space between electrodes by the use of carrier gas to apply the same to the surface of the base material to be treated as illustrated in FIG. 5B. As described above, charge particle are imparted to plasma due to ionization. The life of active species having charges, such as radicals, is shorter than that of active species not having the charges. Therefore, charged particles, such as ion or electron, almost disappear until reaching the base material to be treated after leaving the electrodes, and only particles which do not substantially have charges, such as radicals, remain in the plasma. Therefore, a polymerization reaction of the cationic polymerizable resin is hardly affected. It is also suitable to provide a filter 21 having a charge shielding function at a plasma jetting port for preventing the charged particles from reaching the base material.

In the case of the reduced-pressure plasma treatment, a pressure reducing chamber is required to provide. Meanwhile, the life of the active species in the plasma becomes relatively long, and therefore the distance from the electrodes which are the plasma generation sources to the base material to be treated is lengthened than the distance in the case of the atmospheric pressure plasma treatment in many cases. Therefore, in the reduced-pressure plasma device, even when a charge shielding filter is not provided, the influence on the patterning properties can be suppressed. Mentioned as a reduced-pressure plasma treatment method is a method including forming a plasma atmosphere in the treatment chamber, and then treating the same.

Usable as the plasma generation source and the carrier gas is nonreactive gas, such as helium or argon or reactive gas, such as oxygen, nitrogen, carbon dioxide, or nitrogen oxide. For the purpose of introducing a functional group into the surface of resin, at least one of oxygen atoms and nitrogen atoms is suitably contained. In the case of the atmospheric pressure plasma, even when only the nonreactive gas is used, oxygen plasma can be usually generated under the influence of the air in the environment. In contrast, in the case of the reduced-pressure plasma, the reactive gas, such as oxygen, nitrogen, and carbon dioxide, is used for the treatment. The reactivity of nitrogen plasma is lower than that of oxygen plasma or carbon dioxide plasma and the introduction efficiency thereof into the surface of resin is low. Therefore, the mixing ratio of oxygen gas of 10% or lower is sufficient. However, when the nitrogen plasma is used, the content ratio of nitrogen is suitably higher. When nonreactive gas and nitrogen gas are used without using oxygen, the treatment is performed using nitrogen gas in a proportion of 50% or more and suitably 90% or more.

Even when the plasma treatment is not performed, functional groups, such as a hydroxyl group, an epoxy group, and an oxetane group, are usually present on the surface of the photo-cationic polymerizable resin layer 8. The oxygen plasma treatment further increases a hydroxyl group, so that an oxygen containing group, such as a carboxyl group or a carbonyl group, is introduced into the resin surface. In the nitrogen plasma treatment, nitrogen containing groups, such as an amino group, a nitro group, and a nitroso group, are introduced. To the resin surface which has become very active due to the plasma treatment, oxygen and moisture in the air are likely to be added, and, even in the nitrogen plasma treatment, oxygen containing groups, such as a hydroxyl group, are generated in some cases.

Figure 4E:
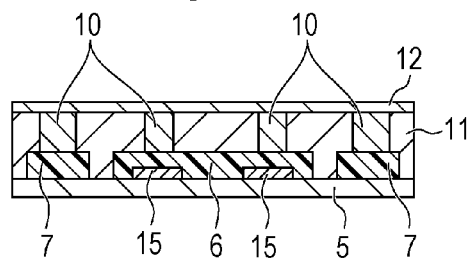

Next, the water repellent layer 12 is formed on the photo-cationic polymerizable resin layer 8 (FIG. 4E). The water repellent layer 12 can be formed by film forming methods, such as a spin coat method, a slit coat method, a roll coat method, a dip coat method, and a vacuum evaporation method, which are generally used. As the water repellent material contained in the water repellent layer 12, compounds having a fluoride containing group are suitably used. Among the compounds, a compound having a perfluoroalkyl group or a perfluoropolyether group is more suitably used because the compounds exhibit high water repellency. Mentioned as the perfluoroalkyl group is, for example, a group represented by the following Formula (2):

(In Formula (2), n is an integer of 3 or more.). Mentioned as the perfluoropolyether group is, for example, a group represented by the following Formula (3):

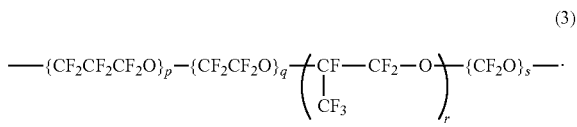

(In Formula (3), p, q, r, and s are 0 or an integer of 1 or more and at least one of them is an integer of 1 or more).

When the number of the repeating units (m, p, q, r, s) of these water repellent groups is compared, p, q, r, and s are larger than n in many cases generally in commercially available water repellent materials. Therefore, a water repellent material having a perfluoropolyether group contains a larger number of fluorine atoms in one molecule than that of a water repellent material having a perfluoroalkyl group and tends to exhibit high water repellency. Moreover, when the average molecular weight of the perfluoropolyether group is excessively small, the water repellency is not developed. When the average molecular weight of the perfluoropolyether group is excessively large, the solubility in a solvent decreases. Therefore, the average molecular weight of the perfluoropolyether group is suitably 500 to 20000 and more suitably 1000 to 10000. In the case of Formula (3) above, the average molecular weight of the perfluoropolyether group represents the average molecular weight of portions represented by the repeating units.

In contrast, as the water repellent material contained in the water repellent layer 12, compounds are used which can react with the photo-cationic polymerizable resin material contained in the photo-cationic polymerizable resin layer 8 to form a bond. When the photo-cationic polymerizable resin material has at least one functional group selected from the group consisting of a hydroxyl group, an epoxy group, and an oxetane group, compounds having a functional group which can react with the functional group to form a bond are mentioned. Specifically mentioned are compounds having a hydrolyzable silyl group and the like at the terminal portion. Mentioned as the water repellent material are, for example, a compound represented by the following Formula (4):

(In Formula (4), Rf represents a perfluoroalkyl group or a perfluoropolyether group, R represents a hydrolyzable substituent, X represents an alkylene group having 1 to 3 carbon atoms, Y represents a non-hydrolyzable substituent, and a represents an integer of 1 to 3.), a compound represented by the following Formula (5):

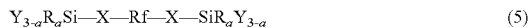

(In Formula (5), Rf, R, X, Y, and a are synonymous with those of Formula (4).), and a compound represented by the following Formula (6):

(In Formula (6), Rf, R, X, Y, and a are synonymous with those of Formula (4), Z represents a hydrogen atom or an alkyl group, and m represents a positive integer.)

Mentioned as the hydrolyzable substituent of R are a halogen atom, an alkoxy group, an amino group, a hydrogen atom, and the like. Among the above, alkoxy groups, such as a methoxy group and an ethoxy group, which are easy to control the reactivity, are suitable. Mentioned as the non-hydrolyzable substituent of Y are alkyl groups, such as a methyl group and an ethyl group. Mentioned as X are a methylene group, an ethylene group, and a propylene group.

Mentioned as commercially available items are Optool DSX and Optool AES (trade names, manufactured by Daikin Industries, LTD.), Novec EGC-1720 (trade name, manufactured by Sumitomo 3M), FG-5010, FG-5020, and FS-2050 (trade names, manufactured by HARVES Co., Ltd.), OPC-700, OPC-800, and XOPC-900 (trade names, manufactured by NODA SCREEN Co., Ltd.), and the like.

When the water repellent material has a hydrolyzable silyl group, hydrolysis occurs due to moisture in the air, so that a silanol group is generated. Furthermore, by heating, a reaction of a silanol group with an epoxy group or a hydroxyl group on the surface of the photo-cationic polymerizable resin layer 8 is promoted. In this case, in order to promote the hydrolysis of the water repellent material and further generate a silanol group, the water repellent layer 12 is suitably formed under an environment containing water. For example, treatment, such as exposure, can be performed under moisturizing but the moisture in the air is sufficient as the moisture amount. Therefore, moisturizing is not indispensable.

The concentration of the water repellent material solution when the water repellent material is applied as a solution is appropriately determined in accordance with the intended use or materials of the photo-cationic polymerizable resin layer 8. The concentration of the water repellent material in the water repellent material solution is suitably 0.01 to 1.0% by mass. The concentration is more suitably 0.05 to 0.5% by mass. When the concentration of the water repellent material is in the range mentioned above, sufficient water repellency and durability are demonstrated, concentration unevenness is not observed on the surface of a coating film, and uniform water repellency is obtained on the entire surface of the coating film. Mentioned as a solvent for diluting the water repellent material are hydrofluorocarbon, perfluorocarbon, hydrofluoroether, hydrofluoropolyether, perfluoropolyether, and the like. The thickness of the water repellent layer 12 is suitably about several nm, e.g., 1 to 10 nm.

Figure 4F:
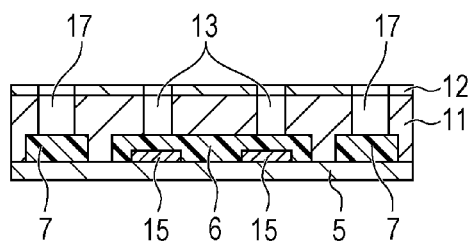

Next, by developing the photo-cationic polymerizable resin layer 8, the non-exposed portions 10 of the photo-cationic polymerizable resin layer 8 are removed and water repellent layer portions corresponding to the non-exposed portions 10 are removed to thereby form the ejection ports 13 and the groove 17 which are the above-described fine patterns (FIG. 4F). According to the conditions described above, the water repellent layer 12 is as thin as about several nm and the water repellent layer portions corresponding to the non-exposed portions 10 can be removed with the non-exposed portions 10 during development. For the development of the photo-cationic polymerizable resin layer 8, a solvent capable of dissolving the non-exposed portions 10 of the photo-cationic polymerizable resin layer 8 can be used.

The solubility of the water repellent layer 12 in the solvent for use in the development is low in many cases. Therefore, cleaning for removing the water repellent material which has not been able to be removed can be performed after development. As a removal solvent for the water repellent layer 12, a fluorine solvent which is the solvent of the above-described water repellent material or a mixed solvent of a fluorine solvent and an organic solvent is suitably used.

Figure 4G:
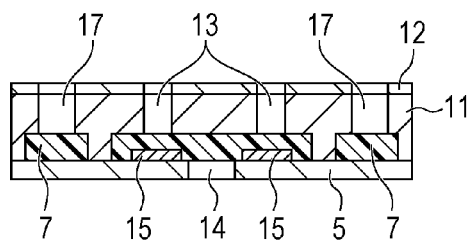
Figure 4H:
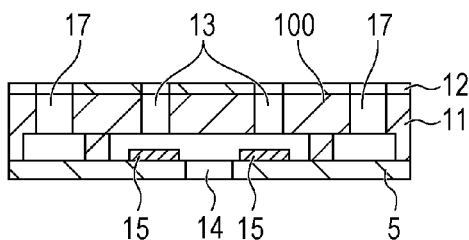

Finally, the ink supply port 14 is produced on the back surface of the substrate 5, and the pattern resist is removed using a solvent capable of dissolving the pattern resist (FIG. 4G). Thereafter, in order to completely cure an uncrosslinked photo-cationic polymerizable resin material in the photo-cationic polymerizable resin layer 8, the curing is promoted by heating (FIG. 4H). Thus, the photo-cationic polymerizable resin layer 8 is formed into a member provided with the ejection ports 13 and the groove 17 which are the above-described fine patterns. In this case, the reaction of the photo-cationic polymerizable resin layer 8 and the water repellent material is further promoted, so that the bond of the member and the water repellent layer 12 can be further strengthened.

EXAMPLES

Hereinafter, exemplary embodiments of the invention will be described in detail.

Example 1

Figure 5:
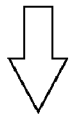
FIG. 5 is a flow chart diagram illustrating an example of the method for manufacturing an inkjet recording head according to aspects of the invention.
Figure 5:
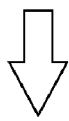
Figure 5:
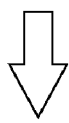
Figure 5:
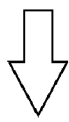
Figure 5:
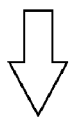
Figure 5:
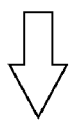
Figure 5:
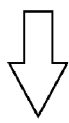

FIGS. 4A through 4H are views illustrating the method for manufacturing the inkjet recording head according to aspects of the invention. FIG. 5 is a flow chart diagram illustrating processes based on FIGS. 4A through 4H.

First, polymethyl isopropenyl ketone (manufactured by Tokyo Ohka Kogyo Co., Ltd., trade name: ODUR-1010) was applied with a film thickness of 14 μm onto the silicon substrate 5 (6 inch wafer) provided with electric wiring, a protective film (not illustrated), and the energy generation elements 15 as appropriate. Subsequently, the patterns of the pattern resist 6 serving as the ink flow path 16 and the pattern resist 7 serving as the foundation were exposed by an exposure device UX3000 (manufactured by USHIO, INC.), and developed by methyl isobutyl ketone, thereby forming the pattern resists 6 and 7 (FIG. 4A).

Next, as illustrated in FIG. 4B, a solution containing the materials shown in Table 1 was applied onto the substrate 5 having the pattern resists 6 and 7, and heat-treatment was performed at 60° C. for 9 minutes. Thus, the photo-cationic polymerizable resin layer 8 was formed. The film thickness of the photo-cationic polymerizable resin layer 8 was 25 μm at portions where the pattern resists 6 and 7 were not present.

TABLE 1

| Epoxy resin | EHPE-3150 (trade name, manufactured by DAICEL CHEMICAL INDUSTRIES, LTD.) | 100 parts by mass |
|---|---|---|
| Additive | 1,4-HFAB (trade name, manufactured by Central Glass Co., Ltd.) | 20 parts by mass |
| Photo-cationic polymerizable resin | SP-172 (trade name, manufactured by ADEKA Cororation) | 6 parts by mass |
| Silane coupling agent | A-187 (trade name, manufactured by GE Toshiba Silicone Co., Ltd.) | 5 parts by mass |
| Solvent | Xylene (trade name, manufactured by Kishida Chemical Co., Ltd.) | 70 parts by mass |

Next, the photo-cationic polymerizable resin layer 8 was exposed by the radiant energy of the irradiation dose of 500 mJ/cm² through the photomask 9 using MPA-600 (trade name, manufactured by Canon, Inc.) in such a manner that the portions where the ejection ports 13 and the groove 17 were formed were the non-exposed portions 10 (FIG. 4C). Furthermore, heat treatment was performed at 90° C. for 4 minutes (FIG. 4D).

Thereafter, a solution was prepared in which the compound represented by the following Formula (7) (actually a mixture of the compounds represented by the following Formula (7)) as the water repellent material was diluted to 0.6% by mass with a fluorine solvent Novec HFE7600 (trade name, manufactured by Sumitomo 3M). The solution was applied onto the photo-cationic polymerizable resin layer 8 by spin coating. Furthermore, by heating at 90° C. for 1 minute, the solvent was evaporated and simultaneously therewith a reaction of the epoxy resin contained in the photo-cationic polymerizable resin layer 8 and the water repellent material was promoted. Thus, the water repellent layer 12 containing a perfluoropolyether group containing water repellent material was formed (FIG. 4E).

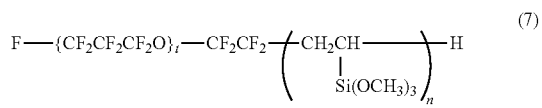

(In Formula (7), t represents an integer of 20 to 30 and n represents an integer of 1 to 3.)

Next, the photo-cationic polymerizable resin layer 8 was developed with a solution of xylene/MIBK=6/4 (mass ratio). By the development treatment, not only the non-exposed portions 10 of the photo-cationic polymerizable resin layer 8 but the water repellent layer portions corresponding the non-exposed portions 10 can be simultaneously removed, thereby forming the ejection ports 13 and the groove 17 (FIG. 4F).

Next, a mask for producing the ink supply port 14 was appropriately disposed on the back surface of the substrate 5, the surface of the substrate 1 was protected with a rubber film (not illustrated), and thereafter the ink supply port 14 was produced by anisotropic etching of the substrate 5. Thereafter, by removing the rubber film and irradiating the entire surface of the substrate 5 with ultraviolet rays using an exposure device UX3000, the pattern resist was decomposed and the pattern resists were dissolved and removed using methyl lactate (FIG. 4G).

In order to completely cure the photo-cationic polymerizable resin layer 8 and to promote the reaction of the epoxy resin and the water repellent material, heat-treatment was performed at 200° C. for 1 hour (FIG. 4H). Thereafter, measures for electrical connection and ink supply were disposed as appropriate, thereby producing an inkjet recording head.

As the evaluation of the produced inkjet recording head, the dynamic contact angle θr to pure water was measured and the existence of dents in the surface of the member provided with the ejection ports 13 was checked. The measurement of the dynamic contact angle θr to pure water was performed using an automatic contact angle meter (product name: CA-W manufactured by Kyowa Interface Science Co., LTD.). The check of the existence of dents in the surface of the member provided with the ejection ports 13 was performed using a color 3D laser beam microscope (product name: VD-9710, manufactured by KEYENCE). The evaluation results are shown in Table 2.

It was confirmed that, in the inkjet recording head produced in this Example, the θr was large and good water repellency was exhibited. Dents were not observed in the surface of the member provided with the ejection ports 13. When printing evaluation was performed using the inkjet recording head, shifted printing and the like were not observed and high printing quality was exhibited.

Examples 2 to 4

Inkjet recording heads were produced by the same operation as in Example 1 using the same water repellent material as that of Example 1 and diluting the water repellent material in such a manner that the concentration thereof was 0.2, 0.1, and 0.025% by mass, and evaluated. The evaluation results are shown in Table 2. Also in the inkjet recording heads produced by any of the methods of Examples 2 to 4, the θr was large and good water repellency was exhibited. Dents were not observed in the surface of the member provided with the ejection ports 13. In printing evaluation, shifted printing and the like were not observed and high printing quality was exhibited.

Examples 5 to 7

As the water repellent material, compounds represented by the following Formula (8), (9), or (10) (actually a mixture of compounds represented by the following Formula (8), (9), or (10)) were used. Inkjet recording heads were produced by the same operation as in Example 1 diluting the water repellent materials were diluted in such a manner that that the concentration thereof was 0.2% by mass. The evaluation results are shown in Table 2.

$$F\text{---}\{CF_2CF_2CF_2O\}_u\text{---}CF_2CF_2\text{---}CH_2O(CH_2)_3\text{---}Si(OCH_3)_3 \quad (8)$$

(In Formula (8), u represents an integer of 20 to 30.)

$$F\{CF_2\}_{10}\text{---}CH_2CH_2\text{---}Si(OC_2H_5)_3 \quad (9)$$

$$(H_3CO)_3Si\text{---}CH_2CH_2\text{---}\{CF_2CF_2O\}_v\text{---}\{CF_2O\}_w\text{---}CH_2CH_2\text{---}Si(OCH_3)_3 \quad (10)$$

(In Formula (10), v represents an integer of 0 to 20 and w represents an integer of 0 to 30.)

It was confirmed that also when the compounds of any of Formulae (8) to (10) were used as the water repellent material, the θr was large and good water repellency was exhibited. Dents were not observed in the surface of the member provided with the ejection ports 13. In printing evaluation, shifted printing and the like were not observed and high printing quality was exhibited.

As described above, good water repellency was exhibited under any of the conditions of Examples 1 to 7, which is considered to result from a reaction of the water repellent material and the epoxy resin.

Comparative Examples 1 to 6

Inkjet recording heads were produced in the same manner as in Example 1, except performing the formation process of the water repellent layer 12 before the exposure of the photo-cationic polymerizable resin layer 8 and changing the type of the water repellent material and the concentration of the water repellent material as shown in the conditions of Table 3. The evaluation results are shown in Table 3. Also in any of Comparative Examples 1 to 6, the θr was large and good water repellency was exhibited but dents were generated in the surface of the member provided with the ejection ports 13. Due to the dents, shifted printing occurred in printing evaluation, so that the image quality decreased.

TABLE 2

| | Conditions | | Evaluation results | |
|---|---|---|---|---|
| Examples | Water repellent material type | Water repellent material concentration/% by mass | Dent | Initial dynamic contact angle θr/° |
| 1 | (7) | 0.6 | Not generated | 94 |
| 2 | | 0.2 | | 108 |
| 3 | | 0.1 | | 101 |
| 4 | | 0.025 | | 90 |
| 5 | (8) | 0.2 | | 104 |
| 6 | (9) | | | 94 |
| 7 | (10) | | | 94 |

TABLE 3

| | Conditions | | Evaluation results | |
|---|---|---|---|---|
| Comparative Example | Water repellent material type | Water repellent material concentration/% by mass | Dent | Initial dynamic contact angle θr/° |
| 1 | (7) | 0.6 | Generated | 92 |
| 2 | | 0.2 | | 107 |

TABLE 3-continued

| | Conditions | | Evaluation results | |
|---|---|---|---|---|
| Comparative Example | Water repellent material type | Water repellent material concentration/% by mass | Dent | Initial dynamic contact angle θr/° |
| 3 | | 0.1 | | 100 |
| 4 | (8) | 0.6 | | 90 |
| 5 | | 0.2 | | 104 |
| 6 | | 0.1 | | 95 |

Example 8

The processes until the formation of the photo-cationic polymerizable resin layer 8 were performed in the same manner as in Example 1. The film thickness of the photo-cationic polymerizable resin layer 8 was 25 µm at the portions where the pattern resists 6 and 7 were not present.

Next, the photo-cationic polymerizable resin layer 8 was exposed using an exposure device MPA-600 (manufactured by Canon, Inc.) with an irradiation dose of 300 mJ/cm² through the photomask 9 in such a manner that the portions serving as the ejection ports 13 and the groove 17 were the non-exposed portions 10 (FIG. 4C). Furthermore, heat treatment was performed at 90° C. for 4 minutes (FIG. 4D).

Thereafter, a solution was prepared in which the compound 7 represented by Formula (7) above (actually a mixture of compounds having different t and n) was diluted to 0.2% by weight with a fluorine solvent Novec HFE7600 (manufactured by Sumitomo 3M, Inc.). 2 ml of the solution was added dropwise onto the photo-cationic polymerizable resin layer 8, and applied by rotating at 500 rpm. Furthermore, by heating at 90° C. for 1 minute, the solvent was evaporated and simultaneously therewith a reaction of an epoxy resin and a hydroxyl group present on the surface of the photo-cationic polymerizable resin layer 8 and a methoxy group or a hydroxyl group of the compound 7 was promoted. Thus, the water repellent layer 12 containing a perfluoropolyether group containing water repellent material was formed (FIG. 4E). When the application was performed also on the silicon wafer under the same conditions, the thickness of the water repellent layer was measured to be about 10 nm using an ellipsometer.

Next, the photo-cationic polymerizable resin layer 8 was developed with a solution of xylene/MIBK=6/4 (weight ratio). By the development treatment, the non-exposed portions 10 of the photo-cationic polymerizable resin layer 8 and the water repellent layer 12 contacting the non-exposed portion 10 were simultaneously removed, thereby forming the ejection port 13 and the groove 17 (FIG. 4F).

Next, a mask for producing the ink supply port 14 was appropriately disposed on the back surface of the substrate 5, the surface of the substrate 1 was protected with a rubber film (not illustrated), and thereafter the ink supply port 14 was produced in the substrate 4 by anisotropic etching using an aqueous tetramethyl ammonium solution (FIG. 4G). Thereafter, by removing the rubber film and irradiating the entire surface of the substrate 5 with ultraviolet rays using an exposure device UX3000, the pattern resists 6 and 7 were decomposed. In order to completely cure the photo-cationic polymerizable resin layer 8 from which the pattern resists 6 and 7 were removed by dissolution using methyl lactate and to promote a reaction of a functional group remaining on the photo-cationic polymerizable resin layer 8 and a functional group of the water repellent layer 12, heat-treatment was performed at 200° C. for 1 hour (FIG. 4H).

As described above, the ejection port member 100 was formed. Thereafter, measures for electrical connection and ink supply were disposed as appropriate, thereby producing an inkjet recording head.

As the evaluation of the produced inkjet recording head, the observation of the surface state of the member 100 provided with the ejection ports 13 was performed using a color 3D laser microscope VD-9710 (manufactured by KEYENCE), for checking the existence of dents and pattern residues. The measurement of the dynamic receding contact angle θr to pure water of the surface of the member was measured using an automatic contact angle meter CA-W (manufactured by Kyowa Interface Science Co., LTD.). Subsequently, the water repellent surface of the ejection port member was immersed in a 60° C. alkaline dye ink BCI-7C (manufactured by Canon, Inc.) for 1 week, and thereafter the θr was measured by the above-described method.

The type and concentration of the water repellent materials and the plasma treatment conditions of Example 8 and the following Examples and Comparative Examples and the evaluation results thereof are collectively shown in Table 4. The compounds 8, 9, and 10 are the compounds represented by Formulae (8), (9), and (10), respectively. The evaluation index of each evaluation result is as follows.

<Dent>
◉: A dent whose diameter is 1 μm or more is not observed and the surface is flat.
Δ: A dent whose diameter is 1 μm or more is observed.
<Residue>
◉: No residue
○: Slight residue (A residue is hardly observed under the microscope and is observed by SEM, and the residue hardly affects the actual ejection.)
<Changes in Contact Angle after Ink Immersion>
◉: A difference of the contact angle after stored and the initial contact angle is lower than 15°.
○: A difference of the contact angle after stored and the initial contact angle is 15° degrees or more and lower than 30°.

Examples 9 and 12

Inkjet recording heads were produced by the same operation as in Example 8, except changing the type and the concentration of the water repellent material as shown in Table 4 and were similarly measured. Also in the inkjet recording heads produced by any of the methods of Examples 9 and 12, dents and residues were not observed in/on the surface and the water repellency was good. In printing evaluation, shifted printing and the like were not observed and high printing quality was exhibited.

Examples 10 and 11

Inkjet recording heads were produced in the same procedure as in Example 1, except changing the type and the concentration of the water repellent material as shown in Table 4 and performing plasma treatment before the application of the water repellent material. Used for the plasma treatment were a reduced-pressure plasma treatment device CDE-7-4 (manufactured by Shibaura Mechatronics Corporation, which is indicated as "Reduced-pressure" in Table 2) and a remote type atmospheric pressure plasma treatment device AP-T03 (manufactured by Sekisui Chemical Co., Ltd., which is indicated as "atmospheric pressure 1" in Table 4). In the atmospheric pressure plasma treatment device AP-T03, a charge shielding plate was used. The evaluation results are shown in Table 4. Also in the inkjet recording heads produced by any of the methods of Examples 10 and 11, dents and residues were not observed in/on the surface and the water repellency was good. In printing evaluation, shifted printing and the like were not observed and high printing quality was exhibited.

Examples 13 to 35

Ejection port patterns of inkjet recording heads were produced on a silicon substrate by the same procedure as in Example 8 using the type and concentration of the water repellent material and the plasma treatment conditions shown in Table 2. Due to simple evaluation, printing evaluation was not performed. The state of the ejection port surface having the ejection port pattern was evaluated from the viewpoint of dents, residues, and the contact angle similarly as in Examples 8 to 12. As the plasma treatment "Atmospheric pressure 2", a direct type plasma treatment device AP-T02 (manufactured by Sekisui Chemical Co., Ltd.) was used. Also in the ejection port members produced by any of the methods of Examples 13 to 35, dents were not observed in the surface and the water repellency was good.

As is seen from the item of the changes after immersion in the evaluation of the contact angle of Table 4, the changes in the water-repellency between the initial water repellency and the water repellency after immersion was small in one subjected to the plasma treatment (e.g., Examples 10 and 11). It can be considered that, by performing the plasma treatment, an inkjet recording head can be used which can be used for a longer period of time and has high reliability.

Composition Analysis

Next, in order to analyze the introduction of a functional group into the surface of resin by the plasma treatment, samples that were/were not subjected to the plasma treatment was subjected to composition analysis of the surface of resin before applying the water repellent material.

In Example 8, the composition analysis of the surface of the cationic polymerizable resin layer 8 in a state where the water repellent layer 12 was formed was performed. For the measurement, an X ray photoelectron spectrum device Quantum 2000 (manufactured by ULVAC-PHI, Inc.) was used. As a result, the element composition of the surface was 23 atom % oxygen atom and 0 atom % nitrogen atom.

In Example 10 and Example 20, the same measurement was also performed for the surface of the cationic polymerizable resin layer 8 after the plasma treatment. The results are shown in Table 5. In the case of the plasma treatment of 100% nitrogen, nitrogen atoms were introduced into the surface of resin. It is considered that an amino group, a nitro group, a nitroso group, a cyano group, and the like were introduced. Moreover, when plasma by a mixed gas of nitrogen/oxygen was used, the oxygen content on the surface of resin increased. It is estimated that oxygen containing groups, such as a hydroxyl group, a carbonyl group, and a carboxyl group, were introduced into the resin surface.

In order to check whether a nitrogen containing group is actually introduced into the resin surface, the surface of the cationic polymerizable resin layers 8 before the application of the water repellent material in Examples 8 and 10 was subjected to surface analysis by a time-of-flight secondary ion mass spectrometer TRIFT V (manufactured by ULVAC-PHI, Inc.). When Au ions were emitted as primary ions, $NH_4^+$, $CN^-$, and $CNO^-$ ions were observed on the surface (Example 10) subjected to the nitrogen plasma treatment as compared with the surface not subjected to the plasma treatment (Example 1). Also from the measurement results, it was confirmed that, by the nitrogen plasma treatment, nitrogen atoms were introduced into the resin surface.

Comparative Example 7

An inkjet recording head was produced in the same manner as in Example 8, except performing the formation process of the water repellent layer 12 before the exposure of the photo-cationic polymerizable resin layer 8. The same evaluation as in Example 8 was performed. The evaluation results are as shown in Table 4. In Comparative Example 7, the θr was large and good high water repellency was exhibited but dents were generated in the surface of the member provided with the ejection ports 13. In printing evaluation, shifted printing occurred. This is considered to result from the influence of the dents of the surface.

Comparative Examples 8 to 15

Inkjet recording heads were produced in the same manufacturing method as in Comparative Example 7, except changing the compound and the concentration of the water repellent material and the plasma treatment as shown in Table 4 and evaluated.

TABLE 4

| | Water repellent material | | Plasma treatment | | | Evaluation | | | |
| --- | --- | --- | --- | --- | --- | --- | --- | --- | --- |
| | | | | | | | | Contact angle | |
| | Type | Concentration | Method | Gas | Treatment time | Dent | Reside | Initial contact angle | Changes after immersion |
| Example 8 | Compound 7 | 0.2 | No treatment | — | — | ○ | ⊙ | 108 | ○ |
| Example 9 | | 0.1 | No treatment | — | — | ○ | ⊙ | 101 | ○ |
| Example 10 | | 0.2 | Reduced-pressure | N2 = 100 | 900 s | ○ | ⊙ | 105 | ⊙ |
| Example 11 | | 0.2 | Atmospheric pressure 1 | N2/O2 = 99/1 | 100 mm/s | ○ | ⊙ | 106 | ⊙ |
| Example 12 | Compound 8 | 0.5 | No treatment | — | — | ○ | ⊙ | 97 | ○ |
| Example 13 | Compound 7 | 0.05 | No treatment | — | — | ○ | ⊙ | 102 | ○ |
| Example 14 | | 0.025 | No treatment | — | — | ○ | ⊙ | 90 | ○ |
| Example 15 | | 1 | No treatment | — | — | ○ | ⊙ | 92 | ○ |
| Example 16 | | 1.5 | No treatment | — | — | ○ | ⊙ | 88 | ○ |
| Example 17 | | 0.2 | Reduced-pressure | N2 = 100 | 300 s | ○ | ⊙ | 102 | ⊙ |
| Example 18 | | 0.2 | Reduced-pressure | N2 = 100 | 60 s | ○ | ⊙ | 99 | ⊙ |
| Example 19 | | 0.2 | Reduced-pressure | N2/O2 = 99/1 | 60 s | ○ | ⊙ | 104 | ⊙ |
| Example 20 | | 0.2 | Reduced-pressure | N2/O2 = 80/20 | 60 s | ○ | ⊙ | 104 | ⊙ |
| Example 21 | | 0.1 | Reduced-pressure | N2/O2 = 50/50 | 60 s | ○ | ⊙ | 105 | ⊙ |
| Example 22 | | 0.2 | Reduced-pressure | N2/O2 = 80/20 | 900 s | ○ | ⊙ | 103 | ⊙ |
| Example 23 | | 0.2 | Atmospheric pressure 1 | CO2 = 100 | 100 mm/s | ○ | ⊙ | 106 | ⊙ |
| Example 24 | | 0.2 | Atmospheric pressure 1 | N2 = 100 | 10 mm/s | ○ | ⊙ | 101 | ⊙ |
| Example 25 | | 0.2 | Atmospheric pressure 1 | N2/O2 = 80/20 | 100 mm/s | ○ | ⊙ | 102 | ⊙ |
| Example 26 | | 0.2 | Atmospheric pressure 1 | Ar = 100 | 10 mm/s | ○ | ⊙ | 100 | ⊙ |
| Example 27 | | 0.2 | Atmospheric pressure 1 | Ar/O2 = 99/1 | 10 mm/s | ○ | ⊙ | 101 | ⊙ |
| Example 28 | | 0.2 | Atmospheric pressure 1 | Ar/O2 = 50/50 | 100 mm/s | ○ | ⊙ | 101 | ⊙ |
| Example 29 | | 0.2 | Atmospheric pressure 2 | N2/O2 = 80/20 | 100 mm/s | ○ | ⊙ | 106 | ⊙ |
| Example 30 | | 0.2 | Atmospheric pressure 2 | Ar/N2 = 50/50 | 10 mm/s | ○ | ⊙ | 102 | ⊙ |
| Example 31 | Compound 8 | 0.2 | No treatment | — | — | ○ | ⊙ | 97 | ○ |
| Example 32 | | 0.2 | Reduced-pressure | N2/O2 = 80/20 | 60 s | ○ | ⊙ | 102 | ⊙ |
| Example 33 | Compound 9 | 1 | No treatment | — | — | ○ | ⊙ | 95 | ○ |
| Example 34 | | 1 | Atmospheric pressure 1 | Ar/O2 = 99/1 | 10 mm/s | ○ | ⊙ | 98 | ⊙ |
| Example 35 | Compound 10 | 0.2 | No treatment | — | — | ○ | ⊙ | 93 | ○ |
| Example 36 | | 0.2 | Atmospheric pressure 1 | Ar/O2 = 99/1 | 10 mm/s | ○ | ⊙ | 95 | ⊙ |
| Comparative Example 7 | Compound 7 | 0.2 | No treatment | — | — | Δ | ⊙ | 105 | ○ |
| Comparative Example 8 | | 0.2 | Atmospheric pressure 2 | N2/O2 = 80/20 | 100 mm/s | Δ | ○ | 106 | ⊙ |
| Comparative Example 9 | | 0.2 | Atmospheric pressure 2 | N2 = 100 | 10 mm/s | Δ | ○ | 101 | ⊙ |
| Comparative Example 10 | | 0.6 | No treatment | — | — | Δ | ⊙ | 89 | ○ |
| Comparative Example 11 | | 0.1 | No treatment | — | — | Δ | ⊙ | 104 | ○ |
| Comparative Example 12 | Compound 8 | 0.2 | No treatment | — | — | Δ | ⊙ | 102 | ○ |
| Comparative Example 13 | | 0.1 | No treatment | — | — | Δ | ⊙ | 98 | ○ |
| Comparative Example 14 | Compound 10 | 0.2 | No treatment | — | — | Δ | ⊙ | 94 | ○ |
| Comparative Example 15 | | 0.1 | No treatment | — | — | Δ | ⊙ | 92 | ○ |

TABLE 5

| Element (atom %) | Treatment conditions | | |
|---|---|---|---|
| | Example 8 No treated | Example 10 N2 | Example 20 N2/O2 |
| C | 77 | 73 | 62 |
| O | 23 | 23 | 36 |
| N | 0 | 3 | 0 |

Aspects of the present invention can provide an inkjet recording head that achieves high-density and high-quality printing by suppressing the generation of dents in a member provided with ejection ports due to the aggregation of a water repellent material and forming an ejection port surface with excellent water repellency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-242246 filed Oct. 28, 2010 and No. 2010-282231 filed Dec. 17, 2010, which are hereby incorporated by reference herein in their entirety.

What is claimed is:

1. A method for manufacturing an inkjet recording head having a substrate, a member provided with an ejection port for ejecting ink formed on the substrate, and a water repellent layer formed on the member, the method comprising:
    forming a photo-cationic polymerizable resin layer containing a photo-cationic polymerizable resin material on the substrate;
    performing pattern exposure of the photo-cationic polymerizable resin layer to form a latent image of a fine pattern including the ejection port;
    forming the water repellent layer containing a water repellent material capable of forming a bond in reaction with the photo-cationic polymerizable resin material on the photo-cationic polymerizable resin layer on which the latent image is formed;
    developing the photo-cationic polymerizable resin layer to thereby remove a non-exposed portion of the photo-cationic polymerizable resin layer and remove a water repellent layer portion corresponding to the non-exposed portion to thereby form the fine pattern; and
    curing the photo-cationic polymerizable resin layer by heat treatment to form a member provided with the fine pattern and promote a reaction of the photo-cationic polymerizable resin material and the water repellent material.

2. The method for manufacturing an inkjet recording head according to claim 1, wherein, in forming the latent image of the fine pattern, the photo-cationic polymerizable resin layer was subjected to pattern exposure and then heated.

3. The method for manufacturing an inkjet recording head according to claim 1, wherein the water repellent material is a compound having a perfluoroalkyl group or a perfluoropolyether group.

4. The method for manufacturing an inkjet recording head according to claim 1, wherein the water repellent material is a compound having a perfluoropolyether group and the average molecular weight of the perfluoropolyether group is 500 to 20000.

5. The method for manufacturing an inkjet recording head according to claim 1, wherein the photo-cationic polymerizable resin material has at least one functional group selected from the group consisting of a hydroxyl group, an epoxy group, and an oxetane group, and the water repellent material has a functional group capable of forming a bond in reaction with the functional group of the photo-cationic polymerizable resin material.

6. The method for manufacturing an inkjet recording head according to claim 1, wherein the water repellent material contains any compound of compounds represented by the following Formula (4), (5) and (6):

$$Rf-X-SiR_aY_{3-a} \quad (4)$$

in Formula (4), Rf represents a perfluoroalkyl group or a perfluoropolyether group, R represents a hydrolyzable substituent, X represent an alkylene group having 1 to 3 carbon atoms, Y represents a non-hydrolyzable substituent, and a represents an integer of 1 to 3,

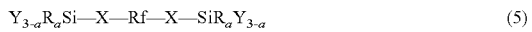

$$Y_{3-a}R_aSi-X-Rf-X-SiR_aY_{3-a} \quad (5)$$

in Formula (5), Rf, R, X, Y, and a are synonymous with those of Formula (4), and

$$Rf \left( \begin{array}{c} X \\ | \\ SiR_aY_{3-a} \end{array} \right)_m Z \quad (6)$$

in Formula (6), Rf, R, X, Y, and a are synonymous with those of Formula (4), Z represents a hydrogen atom or an alkyl group, and m represents a positive integer.

7. The method for manufacturing an inkjet recording head according to claim 1, wherein the photo-cationic polymerizable resin layer contains at least one photo-cationic polymerization initiator of an aromatic iodonium salt and an aromatic sulfonium salt.

8. The method for manufacturing an inkjet recording head according to claim 1, wherein the photo-cationic polymerizable resin layer contains an epoxy compound, a vinyl ether compound, or an oxetane compound.

9. The method for manufacturing an inkjet recording head according to claim 1, wherein the photo-cationic polymerizable resin layer contains an epoxy compound and the equivalent of the epoxy compound is 2000 or lower.

10. The method for manufacturing an inkjet recording head according to claim 1, wherein the photo-cationic polymerizable resin material is a solid at 5 to 35° C.

11. The method for manufacturing an inkjet recording head according to claim 1, wherein the surface of the photo-cationic polymerizable resin layer is subjected to plasma treatment before forming the water repellent layer.

12. The method for manufacturing an inkjet recording head according to claim 11, wherein the plasma treatment is performed using a remote type plasma treatment device.

* * * * *